United States Patent
Schwanzer et al.

(10) Patent No.: US 10,718,642 B2
(45) Date of Patent: Jul. 21, 2020

(54) METHOD FOR CHECKING THE OPERABILITY OF MEASURING TRANSDUCERS

(71) Applicant: ABB Schweiz AG, Baden (CH)

(72) Inventors: Horst Schwanzer, Langenselbold (DE); Tilo Merlin, Linsengericht (DE)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 16/288,125

(22) Filed: Feb. 28, 2019

(65) Prior Publication Data
US 2019/0195667 A1   Jun. 27, 2019

Related U.S. Application Data

(63) Continuation of application No. PCT/EP2017/071903, filed on Aug. 31, 2017.

(30) Foreign Application Priority Data

Sep. 1, 2016 (DE) .......................... 10 2016 116 378

(51) Int. Cl.
*G01R 27/08* (2006.01)
*G01D 18/00* (2006.01)
(Continued)

(52) U.S. Cl.
CPC .............. *G01D 18/00* (2013.01); *G01R 1/203* (2013.01); *G01R 19/0084* (2013.01);
(Continued)

(58) Field of Classification Search
CPC ........ G01R 27/02; G01R 27/14; G01R 1/203; G01R 27/16; G01R 31/2829; G01R 19/0084; H01L 2924/0002; H01L 2924/00
(Continued)

(56) References Cited

U.S. PATENT DOCUMENTS

| 5,481,200 A | 1/1996 | Voegele et al. |
| 2002/0145528 A1* | 10/2002 | Walter .................. G01D 3/024 340/657 |

(Continued)

FOREIGN PATENT DOCUMENTS

| DE | 29917651 U1 | 11/2000 |
| DE | 69429008 T2 | 7/2002 |

(Continued)

*Primary Examiner* — Raul J Rios Russo
(74) *Attorney, Agent, or Firm* — Leydig, Voit & Mayer, Ltd.

(57) ABSTRACT

A method for checking an operability of two-wire measuring transducers in automation technology which output a measurement signal as an impressed loop direct current via a two-wire line and active assemblies of which are supplied with electrical energy via the two-wire line includes: measuring the loop direct current and an input voltage of the measuring transducer; increasing the loop direct current in a range from a minimum value to a maximum value independently of the measured value, while measuring the input voltage of the measuring transducer; storing the measured values of the input voltage at selected measuring points of the loop direct current as an individual signature of the measuring transducer; and, during ongoing operation, measuring the input voltage at connection terminals of the two-wire line via an internal resistance of the measuring transducer at a prevailing loop direct current and recursively comparing that with the signature.

7 Claims, 2 Drawing Sheets

(51) Int. Cl.
　　　*G05B 19/042*　　(2006.01)
　　　*G01R 27/02*　　(2006.01)
　　　*G01R 1/20*　　(2006.01)
　　　*G01R 27/14*　　(2006.01)
　　　*G01R 31/28*　　(2006.01)
　　　*G01R 27/16*　　(2006.01)
　　　*G01R 19/00*　　(2006.01)

(52) U.S. Cl.
　　　CPC ............. *G01R 27/02* (2013.01); *G01R 27/08* (2013.01); *G01R 27/14* (2013.01); *G01R 27/16* (2013.01); *G01R 31/2829* (2013.01); *G05B 19/0425* (2013.01); *G05B 19/0428* (2013.01); *G05B 2219/24015* (2013.01); *G05B 2219/25428* (2013.01); *H01L 2924/00* (2013.01); *H01L 2924/0002* (2013.01)

(58) Field of Classification Search
　　　USPC .......... 324/76.11–76.83, 439, 459, 549, 600, 324/606, 647, 649, 656, 665, 672, 679, 324/691, 705
　　　See application file for complete search history.

(56) References Cited

U.S. PATENT DOCUMENTS

| | | | |
|---|---|---|---|
| 2007/0108925 A1* | 5/2007 | Scholz | G01R 31/2829 318/271 |
| 2008/0013226 A1* | 1/2008 | Kirst | H02H 9/008 361/18 |
| 2009/0110039 A1* | 4/2009 | Kort | H04B 3/54 375/222 |
| 2009/0117873 A1* | 5/2009 | Ferreira | G08C 19/02 455/344 |
| 2014/0363031 A1* | 12/2014 | Notzold | H04R 3/00 381/123 |

FOREIGN PATENT DOCUMENTS

| | | |
|---|---|---|
| DE | 102005047894 A1 | 4/2007 |
| DE | 102007062919 A1 | 6/2009 |

* cited by examiner

METHOD FOR CHECKING THE OPERABILITY OF MEASURING TRANSDUCERS

This application is a continuation of International Patent Application No. PCT/EP2017/071903, filed on Aug. 31, 2017, which claims priority to German Patent Application No. DE 10 2016 116 378.3, filed on Sep. 1, 2016. The entire disclosures of both applications are hereby incorporated by reference herein.

FIELD

The invention relates to a method for checking the operability of two-wire measuring transducers in automation technology, which output a measurement signal as an impressed current.

BACKGROUND

In this case, the measuring transducer is located close to the process and decentrally in the field area and is equipped with sensor means for receiving a physical process variable and means for its conversion into an electrical variable.

For a plurality of measuring transducers, means for their energy supply and for measured value processing and visualization are provided in a central waiting area.

In a two-wire measuring transducer, both the electrical energy supply of the active assemblies of the measuring transducer and the transmission of the measured values to the means of measured value processing and visualization in the waiting area are implemented via a single two-wire line between the measuring transducer in the field area and a measuring transducer supply unit located in the waiting area.

For this purpose, starting from a voltage source arranged in the measuring transducer supply unit, a current loop is formed via the first wire of the two-wire line, the internal resistance of the measuring transducer, the second wire of the two-wire line, and a measuring resistor arranged in the measuring transducer supply unit, the loop current of said current loop being determined as a function of the detected process variable by adequately changing the internal resistance of the measuring transducer. The voltage drop at the measuring resistor is then a measure of the detected process variable of the measuring transducer.

A minimum input voltage across the internal resistance of the measuring transducer is required for supplying energy to the active assemblies of the measuring transducer. If the line impedance is too high and/or the output voltage of the measuring transducer supply unit is too low, a high loop current, as a function of the detected process variable, leads to a high voltage drop across the two-wire line, wherein the required minimum input voltage of the measuring transducer statically falls short.

In applications with long line lengths, such as, for example, tank farms or installations with a central switching room with evaluation units and widely distributed measuring points, increased voltage drop can occur along the current loop. The resistance of the connecting line is, furthermore, dependent upon the ambient temperature. Between the contact points (connection and distribution terminals), transition resistances arise, which depend, inter alia, upon the atmospheric humidity and salt content of the ambient air and tend to increase over the life cycle (corrosion). A voltage drop forms across these resistances when current flows and reduces the operating voltage available to the two-wire measuring transducer. In this case, it may happen that the voltage drop along the line and across the contact points becomes so great that the minimum permissible supply voltage of the measuring transducer falls short.

For this reason, measuring transducers in some cases are monitored and assume a safe fault current or are reset and restarted in the event of a shortfall. This detection is used to avoid unsafe operation with an undefined output signal. Particularly critical is the state when, given a small loop current, the permissible minimum supply voltage of the measuring transducer is still maintained, but does not fall short until the loop current increases. A creeping increase in resistance in the current loop then results in failures when the loop current assumes a higher magnitude.

DE 10 2005 047 894 A1 discloses a method for measuring the supply voltage at the current loop connection of the measuring transducer and going into the safe state when an undervoltage is detected.

The disadvantage of this method is the need to periodically pass through the entire current range, independently of the measured values, in order to thus detect shortfalls in the minimum permissible supply voltage. During this measurement, the evaluation unit or process control must be informed that the measured loop current does not correspond to a measurement signal. The measurement thus requires synchronization between maintenance work and process control with respect to the evaluation of the input signals. Monitoring during normal operation is desirable.

SUMMARY

In an embodiment, the present invention provides a method for checking an operability of two-wire measuring transducers in automation technology which output a measurement signal as an impressed loop direct current via a two-wire line and active assemblies of which are supplied with electrical energy via the two-wire line, the method comprising: measuring the loop direct current and an input voltage of the measuring transducer; increasing the loop direct current in a range from a minimum value to a maximum value independently of the measured value, while measuring the input voltage of the measuring transducer; storing the measured values of the input voltage at selected measuring points of the loop direct current as an individual signature of the measuring transducer; during ongoing operation, measuring the input voltage at connection terminals of the two-wire line via an internal resistance of the measuring transducer at a prevailing loop direct current and recursively comparing that with the signature at the same loop direct current; and triggering a predefined reaction of the measuring transducer as soon as the input voltage at the connection terminals of the two-wire line leaves a predefined tolerance via the internal resistance of the measuring transducer at a prevailing loop direct current.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
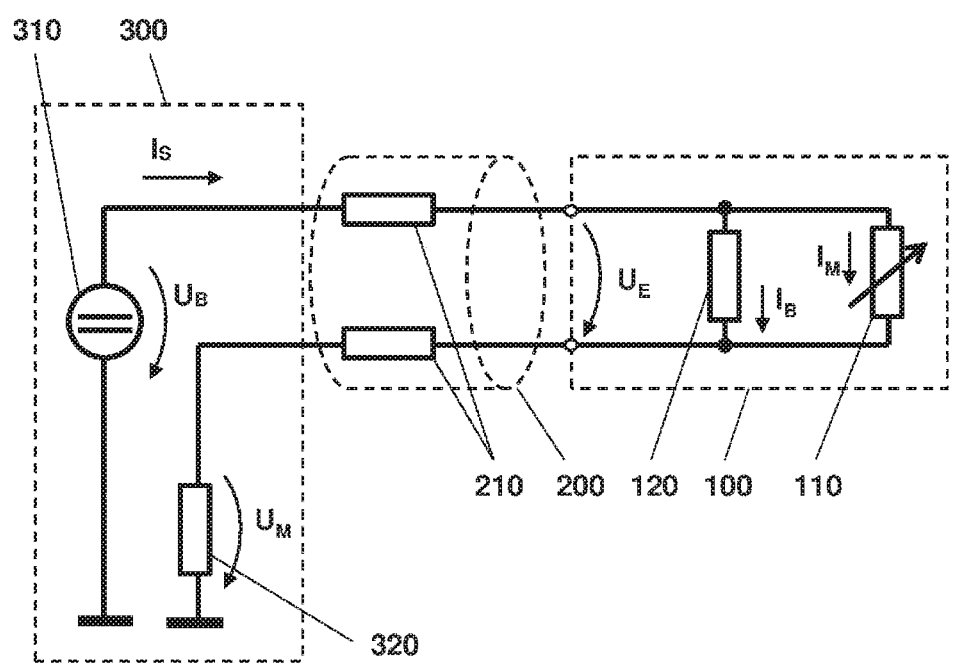
FIG. 1 an equivalent circuit diagram of a measuring transducer feeder circuit

In an embodiment, the invention is therefore based upon the aim of monitoring the operability of a generic measuring transducer during normal operation.

In an embodiment, the invention starts from a measuring transducer of the generic type, in which both the electrical energy supply of the active assemblies of the measuring transducer and the analog communication with the means of measured value processing and measured value visualization in the waiting area are carried out via a single two-wire line between the measuring transducer in the field area and a measuring transducer supply unit located in the waiting area. In this case, the analog communication is directed unidirectionally from the measuring transducer in the field area to the means of measured value processing and visualization in the waiting area and is mapped via the loop direct current of a current loop conducted through the measuring transducer.

In a known preparation step, the loop direct current in the range from the minimum value to the permissible maximum value is passed through at least once, and the terminal voltage at the connection terminals of the two-wire line is measured at selected measuring points of the loop direct current via the internal resistance of the measuring transducer.

According to the invention, the measured values of the terminal voltage at the selected measuring points of the loop direct current are stored as an individual signature of the current loop with the measuring transducer. The voltage reserve at maximum loop current is determined from the signature. The voltage reserve is the difference between the measured value of the terminal voltage at maximum loop direct current and the minimum operating voltage of the measuring transducer. In a further step, the loop resistance of the two-wire line is calculated from the terminal voltage and the loop direct current.

During ongoing operation, the terminal voltage at the connection terminals of the two-wire line is recursively measured via the internal resistance of the measuring transducer at a prevailing loop direct current and compared with the signature at the same loop direct current. This allows a statement about the change of the terminal voltage, and thus, indirectly, of the loop resistance.

As soon as the terminal voltage at the connection terminals of the two-wire line leaves a predefined tolerance via the internal resistance of the measuring transducer at a prevailing loop direct current, a predefined reaction of the measuring transducer is triggered.

In an advantageous development of the invention, the predefined tolerance depends proportionally upon the voltage reserve.

In a further advantageous development of the invention, as predefined reaction of the measuring transducer, the output of a permissible loop current outside the range for transmitting measured values is provided. Particularly in safety-critical applications, the output of such a fault current is, advantageously, a fast signaling type for a fault condition.

In addition, outputting a warning message can be provided.

Unexpected failures which suddenly occur are, advantageously, avoided if, as a result of the measured value, the loop current assumes such a high value that the minimum supply voltage of the measuring transducer falls short as a result of the voltage drop along the current loop. Also eliminated is the repeated checking of the current loop connected with the necessity of passivating the higher-level evaluation unit (not forwarding the measured current signal).

FIG. 1 shows an equivalent circuit diagram of a measuring transducer feeder circuit within the scope of the means necessary to explain the present invention. A measuring transducer 100 is connected via a two-wire line 200 to a measuring transducer supply unit 300 located in the waiting area. The measuring transducer supply unit 300 has at least one DC voltage source 310 with an operating voltage $U_B$ and a measuring resistor 320. Starting from the DC voltage source 310, a conductor loop is guided as a mesh over the two-wire line 200, the measuring transducer 100, and the measuring resistor 320.

The two-wire line 200 has a line resistance 210 per wire, as a function of the cross-section and the length of the line. A loop direct current $I_S$ flows through the current loop guided over the two-wire line 200 and the measuring transducer 100. This loop direct current $I_S$ is composed of an operating current $I_B$ for supplying the measuring transducer 100 and a measuring current $I_M$, wherein the measuring current $I_M$ represents the measured value of the measuring transducer 100.

During the intended use of the measuring transducer 100, the operating current $I_B$ is kept constant.

In the equivalent circuit diagram according to FIG. 1, the measuring transducer 100 has an equivalent resistance 110 and 120 for the current paths of the measuring current $I_M$ and the operating current $I_B$, respectively. The equivalent resistance 120 through which the operating current $I_B$ flows, which latter is constant during the intended use, is illustrated as a fixed resistor, while the equivalent resistance 110 through which the variable measuring current $I_M$ flows is illustrated as a potentiometer. Each of the equivalent resistances 110 and 120 represents complex electronic circuits for obtaining and processing measured values and for maintaining the intended operation of the measuring transducer 100 and form the internal resistance of the measuring transducer 100.

The fixed equivalent resistance 120 symbolizes the load of the circuit of the conductor loop through the active assemblies of the measuring transducer 100, which load is indicated by the operating current $I_B$.

The measuring transducer 100 is equipped with sensor means for receiving a physical process variable and means for its conversion into an electrical variable. During the intended use of the measuring transducer 100, the electrical variable is impressed on the loop direct current $I_S$ as measuring current $I_M$ via the variable internal resistance 110.

In this case, the loop direct current $I_S$ flows through the line resistances 210 of the two-wire line 200, the measuring transducer 100, and the measuring resistor 320. In the measuring transducer 100, the loop direct current $I_S$ is divided into the fixed operating current $I_B$ and the variable measuring current $I_M$.

The flow of the loop direct current $I_S$ produces a voltage drop across the measuring resistor 320, which voltage drop represents the received measured value as measuring voltage $U_M$ after subtracting the portion of the voltage drop caused by the operating current $I_B$.

As a function of the operating voltage $U_B$ of the DC voltage source 310, the impressed loop direct current $I_S$, and the sum of the measuring resistor 320 and the line resistances 210, an input voltage $U_E$ for the two-wire line 200 arises at the connection terminals of the measuring transducer 100. For the operational energy supply of the active assemblies of the measuring transducer 100, with reference to FIG. 2, a minimum input voltage $U_{EM}$ across the internal resistance of the measuring transducer 100 is required. In the case of line resistances 210 of the two-wire line 200 that are too high and/or an operating voltage $U_B$ of the DC voltage source 310 of the measuring transducer supply unit 300 that is too low, a high loop direct current $I_S$, as a function of the detected process variable, results in such a high voltage drop across the line resistances 210 of the two-wire line 200 that the required minimum input voltage $U_{EM}$ of the measuring transducer 100 statically falls short.

Figure 2:
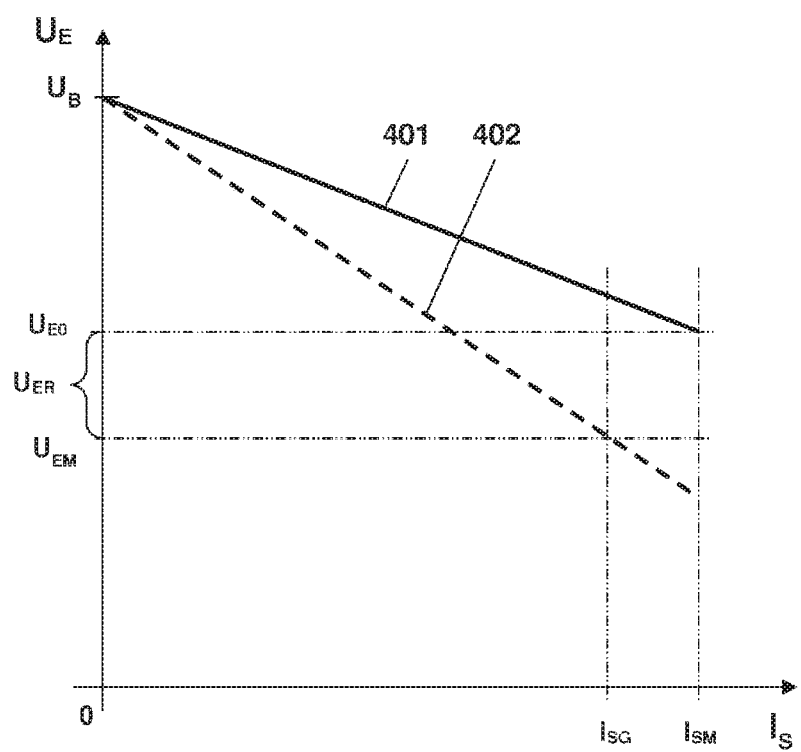
FIG. 2 an illustration of characteristic curves for operability, in a current/voltage diagram

In this respect, FIG. 2 shows a diagram in which, for a first characteristic curve 401 and a second characteristic curve 402, the input voltage $U_E$ is plotted against the loop direct current $I_S$. In this case, the first characteristic curve 401 shows the voltage curve of the input voltage $U_E$ of an operational measuring transducer 100. As the first characteristic curve 401 shows, the input voltage $U_{E0}$ is always greater than the minimum input voltage $U_{EM}$ of the measuring transducer 100, even at the maximum value $I_{SM}$ of the loop direct current $I_S$.

The difference between the input voltage $U_{E0}$ at the maximum value $I_{SM}$ of the loop direct current $I_S$ and the required minimum input voltage $U_{EM}$ of the measuring transducer 100 is called voltage reserve $U_{ER}$.

In contrast thereto, the second characteristic curve 402 shows the voltage curve of the input voltage $U_E$ of a less than fully operational measuring transducer 100. As soon as the loop direct current $I_S$ exceeds a limiting current $I_{SG}$, the input voltage $U_E$ falls below the required minimum input voltage $U_{EM}$, and the measuring transducer 100 shuts off.

For checking the operability, the loop direct current $I_S$ is, according to the invention, increased, starting from the minimum value in the direction of the maximum value $I_{SM}$, independently of the measured value, and, in the process, the input voltage $U_E$ of the measuring transducer 100 is measured, and stored as an individual signature of the current loop with the measuring transducer 100.

To this end, the input voltage $U_E$ is measured at two extreme loop direct currents $I_S$, and the values of further tuples, consisting of loop direct current $I_S$ and associated input voltage $U_E$, are interpolated. It is, in particular, provided that the extreme loop direct currents $I_S$ be outside the range of the measuring current $I_M$.

In a first embodiment of the invention, coefficients of an equation system are calculated from the measured tuples and stored as a signature.

In an alternative embodiment of the invention, the interpolated tuples of the loop direct current $I_S$ and associated input voltage $U_E$ are stored in the form of a table.

From the signature, the voltage reserve $U_{ER}$ at maximum loop current $I_{SM}$ is determined. In a further step, the loop resistance of the two-wire line 200 is calculated from the input voltage $U_E$ and the loop direct current $I_S$.

The recording of the signature is, expediently, already carried out for the first time during commissioning of the measuring transducer 100. The automatic retrieval of the checking process during the commissioning process is particularly advantageous in this respect.

During ongoing operation, the input voltage $U_E$ at the connection terminals of the two-wire line 200 is recursively measured via the internal resistance of the measuring transducer 100 at a prevailing loop direct current $I_S$ and compared with the signature, characteristic curve 401, at the same loop direct current $I_S$. This allows a statement about the change of the input voltage $U_E$, and thus, indirectly, of the loop resistance.

If the input voltage $U_E$ at the connection terminals of the two-wire line 200 leaves a predefined tolerance via the internal resistance of the measuring transducer 100 at a prevailing loop direct current $I_S$, a predefined reaction of the measuring transducer 100 is triggered. In an advantageous development of the invention, the predefined tolerance depends proportionally upon the voltage reserve $U_{ER}$.

In a further advantageous development of the invention, as predefined reaction of the measuring transducer 100, the output of a permissible loop current $I_S$ outside the range for transmitting measured values is provided. Particularly in safety-critical applications, the output of such a fault current is, advantageously, a fast signaling type for a fault condition.

As already stated, the loop direct current $I_S$ is composed of the operating current $I_B$ and the measuring current $I_M$. In an industrially common 4-20 mA current loop, the operating current $I_B$ is adjusted to 4 mA, and the measuring range is mapped onto a current range of the measuring current $I_M$ of 0-16 mA. The range of the loop direct current $I_S$ is thus 4-20 mA during the intended use. All current intensities outside the range of 4-20 mA lie outside the valid measuring range and are interpreted by the measuring transducer supply unit 300 as fault current. For quick signaling of a fault condition, each loop direct current $I_S$ of 4 mA$>I_S>$20 mA is thus suitable.

In addition, outputting a warning message, when a shortfall in the minimum supply voltage $U_{EM}$ in the case of a loop current $I_S>=20$ mA is already expected, or when the input voltage $U_E$ is noticeably deteriorating in relation to the stored signature, may be provided.

Advantageously, unexpected failures, which occur suddenly when, as a result of the measured value, the loop current $I_S$ assumes such a high value that the minimum supply voltage $U_{EM}$ of the measuring transducer 100 falls short as a result of the voltage drop across the current loop, are avoided. Also eliminated is the repeated checking of the current loop connected with the necessity of passivating the higher-level evaluation unit 300 (not forwarding the measured current signal).

A further advantageous embodiment of the invention can provide that this check be carried out during the intended use of the measuring transducer 100 as needed, and/or regularly. The need can, in this case, be initiated by alarms and/or error messages which result from irregularities or unexpected reactions of the automation system or parts thereof. Measurement pauses between two successive measuring processes are particularly suitable for this purpose.

In a particular embodiment of the invention, the fault condition is reported with a DC-compensated AC signal to means of measured value processing and visualization in the waiting area. To this end, the generic measuring transducer 100 is equipped with means for digital communication with the means of measured value processing and visualization in the waiting area. The digital communication between the measuring transducer 100 in the field area and the means of measured value processing and visualization in the waiting area takes place bidirectionally, by means of a DC-compensated AC signal.

The FSK (frequency shift keying) method, in particular, which is customary in automation systems and in which a frequency for representing a logic zero and a further frequency for representing a logic one are shift-keyed alternately, according to the bit stream to be transmitted, is for this purpose.

In addition, the transmission may be based upon a transmission protocol. For communication in automation systems, the HART protocol and various fieldbuses, in particular, are customary in this respect.

Advantageously, the use of a DC-compensated AC signal for transmission of the message prevents any manipulation of the loop direct current $I_S$ on the two-wire line 200, and thus of the input voltage $U_E$ across the internal resistances 110 and 120 of the measuring transducer 100. As a result, the fault detected is immediately displayed to the remote operating personnel—in particular, when checking the measuring transducer 100 as needed or regularly. Consequently, the lack of operability of the affected measuring transducer 100 is immediately recognized, so that the intended use of a non-operational measuring transducer 100 is avoided.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

100 Measuring transducer
110, 120 Equivalent resistance
200 Two-wire line
210 Line resistance
300 Measuring transducer supply unit
310 Voltage source
320 Measuring resistor
401, 402 Characteristic curve
$I_S$ Loop direct current
$I_B$ Operating current
$I_M$ Measuring current
$U_B$ Operating voltage
$U_E$ Input voltage
$U_M$ Measuring voltage

What is claimed is:

1. A method for checking an operability of a two-wire measuring transducers in automation technology which outputs a measurement signal as an impressed loop direct current via a two-wire line and active assemblies of which are supplied with electrical energy via the two-wire line, the method comprising:
    measuring the impressed loop direct current and an input voltage of the two-wire measuring transducer;
    increasing the impressed loop direct current in a range from a minimum value to a maximum value independently of the measured value, while measuring the input voltage of the two-wire measuring transducer;
    storing the measured values of the input voltage at selected measuring points of the impressed loop direct current as an individual signature of the two-wire measuring transducer;
    during ongoing operation, measuring the input voltage at connection terminals of the two-wire line via an internal resistance of the two-wire measuring transducer at a prevailing impressed loop direct current and recursively comparing that with the signature at the same impressed loop direct current; and
    triggering a predefined reaction of the two-wire measuring transducer as soon as the input voltage at the connection terminals of the two-wire line leaves a predefined tolerance via the internal resistance of the two-wire measuring transducer at the prevailing impressed loop direct current.

2. The method according to claim 1, wherein a voltage reserve at maximum loop current is determined from the signature as a difference between the input voltage at the maximum value of the impressed loop direct current and the required minimum input voltage of the two-wire measuring transducer.

3. The method according to claim 2, wherein the predefined tolerance of the input voltage is derived from the voltage reserve.

4. The method according to claim 1, wherein the input voltage is measured at two extreme impressed loop direct currents, and the values of further tuples comprising impressed loop direct current and associated input voltage are interpolated.

5. The method according to claim 4, wherein the interpolated tuples of the impressed loop direct current and associated input voltage are stored in a form of a table.

6. The method according to claim 4, wherein coefficients of an equation system are calculated from the measured tuples and stored as a signature.

7. The method according to claim 4, wherein the extreme impressed loop direct currents are outside the range of the measuring current.

* * * * *